United States Patent [19]

Fredriksen et al.

[11] 4,328,553
[45] May 4, 1982

[54] METHOD AND APPARATUS FOR TARGETLESS WAFER ALIGNMENT

[75] Inventors: Thorbjoern R. Fredriksen, Santa Clara, Calif.; Philippe Villers, Concord, Mass.

[73] Assignee: Computervision Corporation, Bedford, Mass.

[21] Appl. No.: 184,690

[22] Filed: Sep. 8, 1980

Related U.S. Application Data

[63] Continuation of Ser. No. 748,310, Dec. 7, 1976, abandoned.

[51] Int. Cl.³ .................. G06F 15/46; H04N 7/18
[52] U.S. Cl. .................. 364/559; 356/152; 356/400; 358/101; 364/167
[58] Field of Search ............. 364/107, 117, 559, 475; 358/101; 318/626, 627, 678, 646; 33/174 L, 7 A; 356/152, 375–400

[56] References Cited

U.S. PATENT DOCUMENTS

| | | | |
|---|---|---|---|
| 3,207,904 | 9/1965 | Heinz | 356/400 |
| 3,335,281 | 8/1967 | Willits | 356/400 |
| 3,551,052 | 12/1970 | Reiber | 356/380 |
| 3,598,978 | 8/1971 | Rempert | 364/107 |
| 3,628,002 | 12/1971 | Meese et al. | 364/117 |
| 3,670,153 | 6/1972 | Rempert et al. | 364/107 |
| 3,764,218 | 10/1973 | Schedewie | 356/152 |
| 3,809,488 | 5/1974 | Sonderegger | 318/646 |
| 3,814,845 | 6/1974 | Hurlbrink et al. | 358/101 |
| 3,836,834 | 9/1974 | Abbatiello et al. | 364/475 |
| 3,899,634 | 8/1975 | Montone et al. | 358/101 |
| 3,907,439 | 9/1975 | Zanoni | 356/375 |
| 3,988,535 | 10/1976 | Hickman et al. | 358/101 |

FOREIGN PATENT DOCUMENTS

61062 4/1968 German Democratic Rep. ................... 364/559

OTHER PUBLICATIONS

Khoury: Analog Automatic Wafer Alignment for Fine Positioning, IBM *Technical Disclosure Bulletin*, p. 2895, vol. 17, No. 10, Mar. 1975.

*Primary Examiner*—Felix D. Gruber
*Attorney, Agent, or Firm*—Richard J. Birch

[57] ABSTRACT

A method and apparatus for targetless X, Y and θ alignment of a semiconductor wafer having thereon a large number of identical microcircuits or dies that are arranged in a pattern to form rows and columns separated by scribe lines or "streets." The orientation of the wafer is defined by the location of the wafer flat. Each one of the scribe lines or "streets" has a known angular relationship with the wafer flat. The alignment method and apparatus utilizes the wafer "street" pattern for identification instead of special targets located on the wafer. Coarse alignment of the wafer is achieved by locating the wafer flat and then rotating the wafer into approximately correct orientation. Fine alignment of the wafer is performed by opto-electrically locating the edge of a "street" and then rotating the wafer until the "street" edge is parallel to either the X or Y principal axis. In the preferred embodiment independent Z-axis compensation is provided to compensate for dimensional surface variations in the wafer.

8 Claims, 12 Drawing Figures

METHOD AND APPARATUS FOR TARGETLESS WAFER ALIGNMENT

This is a continuation, of application Ser. No. 748,310 filed Dec. 7, 1976 and now abandoned.

BACKGROUND OF THE INVENTION

This invention relates to pattern recognition techniques in general and, more particularly, to a method and apparatus for aligning a thin flat disc or square with respect to a repeatable pattern formed or implemented on the surface of the disc. In the preferred embodiment, the method and apparatus is employed to provide targetless alignment of a semiconductor wafer by utilizing the "street" pattern formed by the dies for identification.

In many semiconductor processing operations, the wafer must be accurately positioned so that the circuit patterns are aligned in X, Y and theta with respect to a predetermined object, such as, a photomask, prior photoresist patterns, probe tips, markers, bonders and the like.

Historically, the alignment function has been performed by human operators through microscope viewing and manual equipment manipulation. The manual technique suffers from disadvantages in handling damage, operator error and inconsistent performance.

In recent years, automatic alignment has been achieved in the photomask/wafer alignment field. Here, purposely designed target patterns were introduced in certain die positions of the wafer to facilitate automatic machine alignment. The so-called "target" technique has been implemented in volume production. One representative automatic aligner is the Cobilt AF-2800 automatic aligner sold by the Cobalt Division of The Computervision Corporation under the trademark AUTOLIGN.

Another alignment method that has been described in the literature utilizes the wafer circuit pattern in conjunction with an artificial boundary type target. The artificial target is superimposed on a TV camera image of the wafer. Representative examples of this technique are described in U.S. Pat. Nos. 3,814,845 and 3,899,634.

Both the special target type automatic aligners and the automatic aligners that use an artificial boundary type target are dependent on means for locating the circuit pattern substructure i.e., the alignment techniques are mainly die oriented as opposed to wafer oriented. In the case of the aligners that operate with special targets, the targets take up valuable wafer geometry and preclude aligning wafers without such targets. Although the artificial boundary type target aligners permit full utilization of wafer geometry, the boundary type aligners suffer from lack of global alignment ability and pattern dimension flexibility with respect to resolution.

It is accordingly a general object of the present invention to provide a method and apparatus for targetless alignment of a semiconductor wafer which eliminates the problems associated with the prior art aligners.

It is a specific object of the invention to provide a method and apparatus for aligning a semiconductor wafer which utilize the die pattern itself rather than any special targets.

It is another object of the invention to provide a method and apparatus for three axis alignment of a disoriented disc or wafer in a targetless mode.

It is still another object of the invention to provide targetless three axis alignment together with Z-axis compensation.

It is a further detailed object of the invention to provide a simple and relatively inexpensive method and apparatus for Z-axis compensation in semiconductor processing equipment, such as, probers.

It is a feature of the invention that the method and apparatus does not require any special targets on the semiconductor wafer and utilizes the die pattern itself for orientation.

It is another feature of the invention that the requisite degree of alignment accuracy is achieved through a readily implemented interactive process.

These objects and other objects and features of the invention will best be understood from a detailed description of a preferred embodiment thereof selected for purposes of illustration and shown in the accompanying drawings in which:

FIGS. 4A and 4B are enlarged views of a portion of the semiconductor wafer illustrating two different pad patterns in the "street" between the microcircuits;

Figure 1:
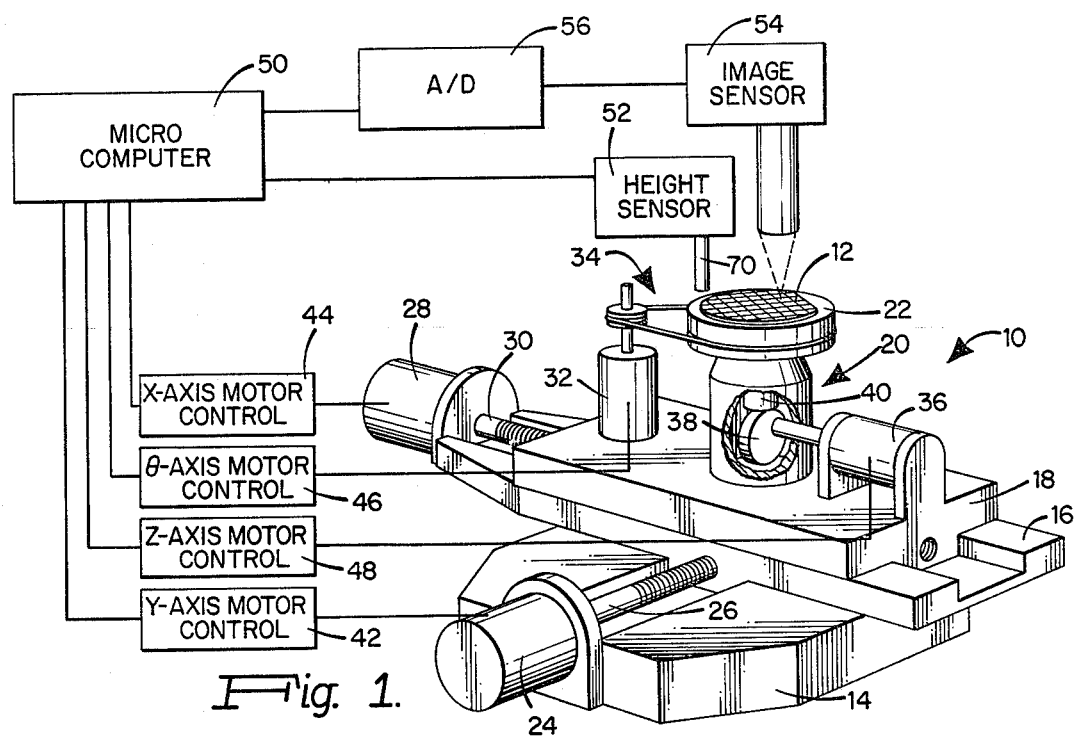
FIG. 1 is a diagrammatic view in perspective and partial block diagram form of a targetless wafer aligner constructed in accordance with the present invention.

Turning now to the drawings and particularly to FIG. 1 thereof, there is shown in perspective view and partial block diagram form a targetless aligner constructed in accordance with the present invention and indicated generally by the reference numeral 10. The aligner 10 provides four axis movement for a work piece such as, a semiconductor wafer or disc 12. The four axis motions of the semiconductor disc 12 are referenced to a fixed or "ground" object such as, an aligner base 14.

The four axis motions of the semiconductor disc 12 are controlled through the structure illustrated diagrammatically in FIG. 1. A Y-axis movable table 16 is slidably mounted on the aligner base 14. The Y-axis table provides a slidable support for an X-axis movable table 18 upon which is mounted a work piece support indicated generally by the reference numeral 20. The work piece support 20 includes a rotatable platform or chuck 22 that is rotatably about the theta axis and movable along the Z-axis.

All four axis motions are controlled individually through separate motors and associated control circuitry. Movement of the Y-axis table 16 is provided by means of a Y-axis motor 24 and its associated lead screw 26. Similarly, movement of the X-axis table is achieved by means of an X-axis motor 28 and its associated lead screw 30. Rotation of the wafer support platform 22 about the theta axis is provided by theta axis motor 32 and its associated pulley drive belt system indicated generally by the reference numeral 34. Z-axis movement of the wafer support platform 22 is obtained from a Z-axis motor 36. The rotational motion of the Z-axis motor is translated to a Z-axis movement of the wafer support platform 22 through an appropriate mechanical system that is illustrated representationally in FIG. 1 by a cam and cam follower 38 and 40, respectively.

Preferably, the four axis motors 24, 28, 32 and 36 are DC stepper motors that are individually controlled by the corresponding, X, Y, theta and Z motor control circuits, 42, 44, 46 and 48, respectively. For wafer alignment, the motion resolution is typically 0.0001 inch in X, Y and Z and 8 seconds of arc in rotation (theta).

A microcomputer 50 is employed to initiate all motions by transferring an appropriate set(s) of control and sense instructions to the motor controllers 42-48. The informational inputs to the microcomputer 50 are obtained from a height sensor 52 and an image sensor 54, the output of which is converted to digital form by A/D 56. The operation of the height and image sensors will be described in greater detail below after a discussion of the characteristics of the semiconductor wafer 12.

Figure 2A:
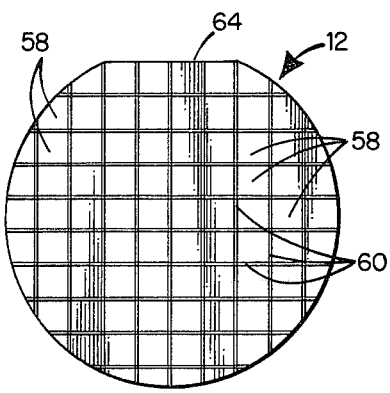
FIG. 2A is a plan view of a semiconductor wafer having a plurality of microcircuits formed thereon.
Figure 2B:
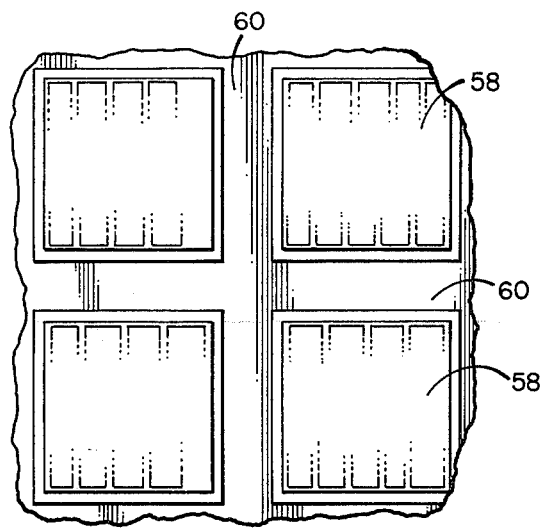
FIG. 2B is an enlarged view of a portion of the semiconductor wafer of FIG. 2A.
Figure 3:
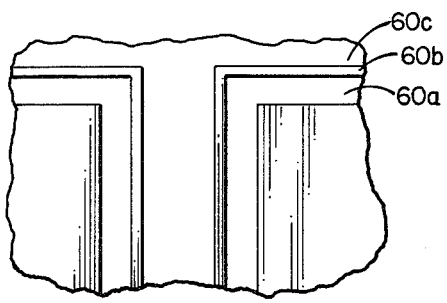
FIG. 3 is another enlarged view of a portion of the semiconductor wafer illustrating a plurality of "streets" between the microcircuits.

Referring to FIGS. 2 through 4, the semiconductor wafer 12 contains a large number of identical microcircuits or dies 58 that are arranged in a pattern of rows and columns separated by scribe lines or "streets" 60. Contact pads 62 are located around the circumference of each die 58 providing input-output connections for testing and later packaging leads. The die-to-die dimensions are known quantities and the die positions are symmetrically arranged. Thus, by accurately locating a street corner, all circuits can be reached by known displacements of the wafer.

It has already been mentioned that one of the applications for the target aligner of the present invention is in an automatic wafer prober. The normal procedure for a wafer prober is to sequentially test individual die in a row or column. The wafer rows and columns are aligned parallel to the principal X and Y axes of mechanical motion. Thus, when probing a series of die in one column, the movable stage mechanism holding the wafer is only required to move in the Y direction.

Orientation of the wafer 12 is defined by the location of a wafer flat 64 shown in FIG. 2A. The circular outline of the wafer is broken by a straight cord cut which defines the wafer flat 64. In some instances, more than one flat can exist on the wafer, but always one is larger and has a specific angular relationship with the scribe lines or "streets" 60 on the wafer.

Figure 4A:
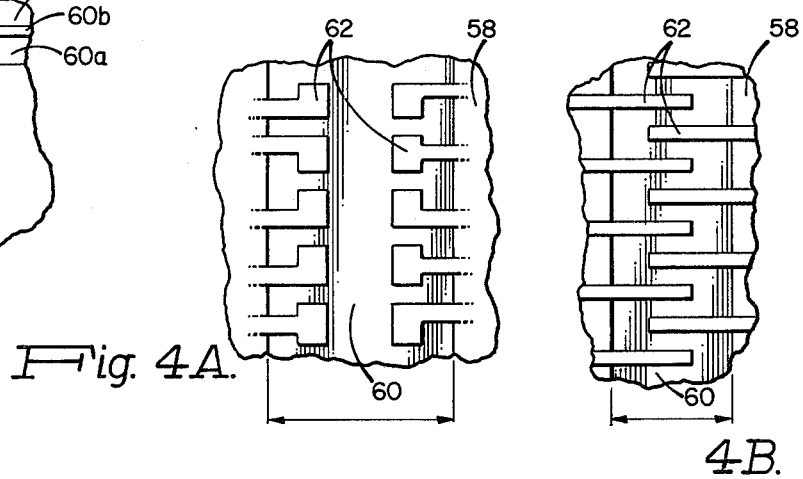
Figure 4D:
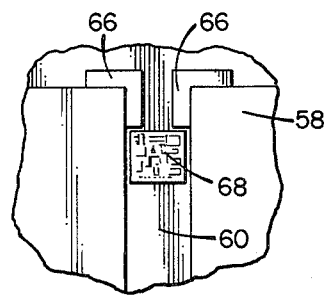
FIG. 4D is again similar to FIGS. 4A and 4B, but illustrates corner designs at the corners of the microcircuits and special circuits within the "street;"
Figure 4C:
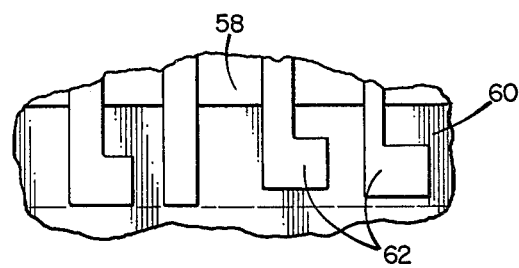
FIG. 4C is similar to FIGS. 4A and 4B, but illustrates uneven edges for the pads.

It will be appreciated that various geometries can be employed in defining the circuit patterns on the wafer or disc 12. Looking at FIG. 3, there are shown a plurality of streets identified as 60a, 60b and 60c. The area within the street may be occupied by circuit pads 62 as shown in FIGS. 4A and 4B and the edges of these circuit pads may be uneven as depicted in FIG. 4C. In addition, the dies 58 may have corner designs 66 as shown in FIG. 4D and/or special circuits 68 positioned within the area of the streets 60. In this case, the corner designs and special circuits can be considered as "clutter" in the streets. The targetless alignment method and apparatus of the present invention can accommodate the wafer geometries and street conditions illustrated in FIGS. 2 through 4.

The following discussion of the implementation of the targetless alignment technique of the present invention can best be understood by referring to FIGS. 1 and 5 through 7. The alignment technique is based on the following concepts:

(a) locate the wafer flat 64 and rotate the wafer 12 into an appropriate orientation (e.g. maximum theta error ±5°);

(b) locate a central street 60 by recognizing its special reflective characteristics as opposed to the circuit patterns 58.

(c) locate the same street one die length away, calculate theta error and correct;

(d) successive iteration of locating the same street along a principal axis followed by theta correction to a final theta orientation within a minimum theta increment; and, (e) locate central cross street and calculate all whole die positions.

In the case of an automatic wafer probe, the purpose of the targetless alignment system is to place each microcircuit or die on the wafer in precise contact with a set of test probers (not shown) and to implement this, four types of motion i.e. X, Y, theta and Z are utilized. The four wafer movement mechanisms are driven by the previously mentioned stepper motors 24, 28, 32 and 36 with control thereof provided by the microstepping controllers 42-48, respectively. It should be observed that the wafer 12 can be moved in Z or theta independently of its X, Y position.

The height and image sensors 52 and 54, respectively, are located in a plane parallel to, but spaced from the plane of the wafer 12. The plane of the wafer 12 itself is parallel to and spaced from the ground plane containing the X and Y principal axes. Alternatively, the X and Y axes can be considered as lying in the plane of the wafer.

A variety of conventional equipment can be employed to obtain an electric indication of the Z-axis position of the disc 12 with respect to the X-Y reference plane. In the preferred embodiment, the height sensor 52 includes a capacitance probe 70. When the wafer surface is positioned at a predetermined distance from the surface of the capacitance probe 70, the height sensor 52 produces an output signal having a known characteristic e.g. a known voltage level. Variations from this reference output are detected by the microcomputer 50 which outputs a Z-axis correction signal to the Z-axis motor controller 48. The motor controller operates the Z-axis motor 36 to maintain a predetermined spacing between the capacitance probe 70 and the surface of the wafer 12.

Figure 5:
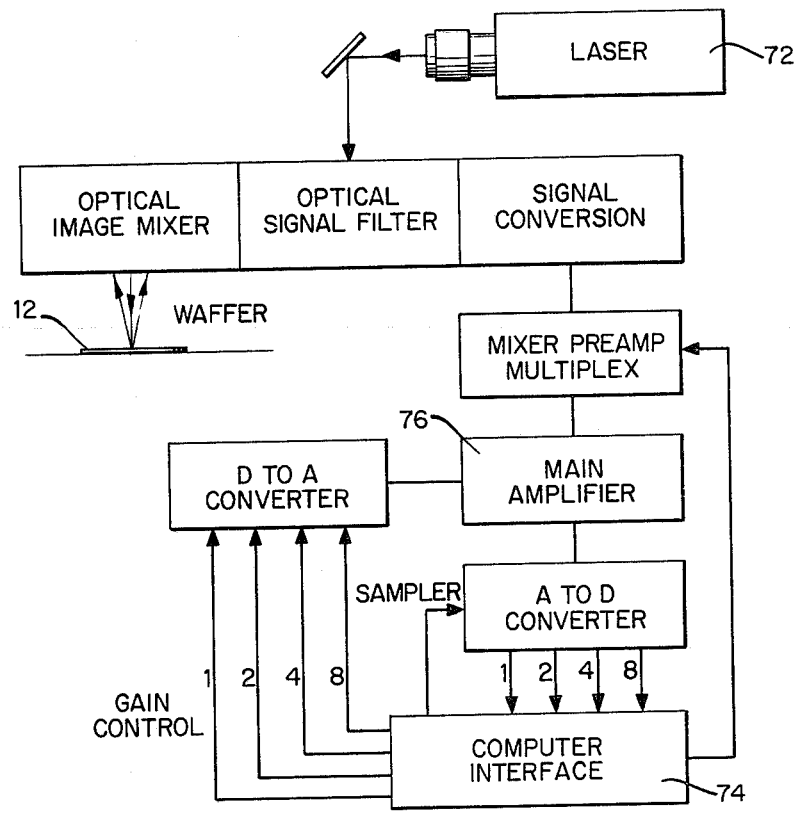
FIG. 5 is a simplified block diagram of the aligner.

FIG. 5 illustrates in simplified form the pattern recognition system employed in the targetless aligner of the present invention. This figure expands upon the image sensor and A/D blocks shown in FIG. 1. A neon-helium laser 72 provides the light source for the pattern recognition system shown in block form in FIG. 5. The microcomputer 50 (FIG. 1) controls the image conversion parameters and the digital data stream through a computer interface 74. The data stream is filtered by a sequential algorithm with each step of the algorithm containing a multiple choice pattern comparison with iteration simplification.

The hardware applies adaptive control to eliminate wafer-to-wafer differences as well as normal circuit aging effects. The simplified system shown in FIG. 5 illustrates the conversion from instantaneous optical image to parallel digital data output.

The computer interface 74 controls the gain of main amplifier 76, initiates a sampling (converting the instananeous analogue value of the image to a digital number) and reads the sample in digital form. In the preferred embodiment, the laser spot size on wafer 12 is approximately 0.5 mils in diameter and the maximum sampling rate is 25 Hkc. Hence, at a maximum speed of 5 inches per second, the image number can be read once every 0.2 mils of motion. The data is controlled directly by the computer and correlated precisely with the wafer position. Although a laser has been described herein, it will be appreciated that a video camera or a flying spot scanner and detector can be employed to generate the desired signals.

The alignment process is performed in two major steps; an initial, course alignment of the wafer and then a fine alignment of the wafer. During the initial set-up procedure, the first wafer is used as a height reference to establish the desired Z-axis position of the wafer. At this position the height sensor 52 output signal has a known characteristic as previously discussed. Subsequent wafers are aligned to this reference position through the operation of the height sensor 52, Z-axis motor control 48 and Z-axis motor 36.

The prealignment of the semiconductor wafer 12 is predicted on the wafer flat 64 being located in a fixed orientation with respect to the pattern of microcircuits 58 on the wafer. In the preferred embodiment, the height sensor 58 is utilized to locate the wafer flat. With the wafer 12 located on the chuck or platform 22, the edge of the wafer is determined by detecting the change in the output signal from the height sensor 52 when the height sensor traverses the edge of the wafer. Then by using the image sensor in conjunction with the combined rotation of the wafer with X-Y motion, the edge of the wafer is tracked. The wafer flat 64 shows a number of edge points to approximate a straight line as opposed to the regular wafer curvature. While the light field embodiment has been described herein as an illustrative embodiment, conceptually a dark field approach is equally applicable, in which case the signals are produced by the transitions from an "off" street to an "on" street condition and vice versa.

Having found the wafer flat, the computer 50 calculates the angle and through appropriate signals to the theta axis motor control 46 the wafer is rotated into correct orientation. After rotation, the wafer diameters are measured by scanning the image sensor 54 across the wafer. Given the knowledge of the location of the major wafer flat 64, the precise wafer center can be determined. With the wafer now coursely aligned, the targetless aligner now performs the fine alignment procedure.

Figure 6:
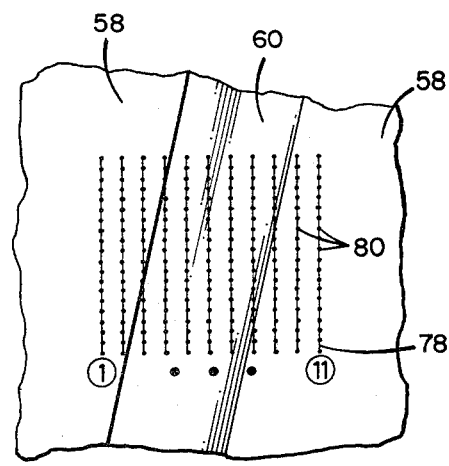
FIG. 6 is an enlarged view of a street between two microcircuits showing the line scans of the street and microcircuits.
Figure 7:
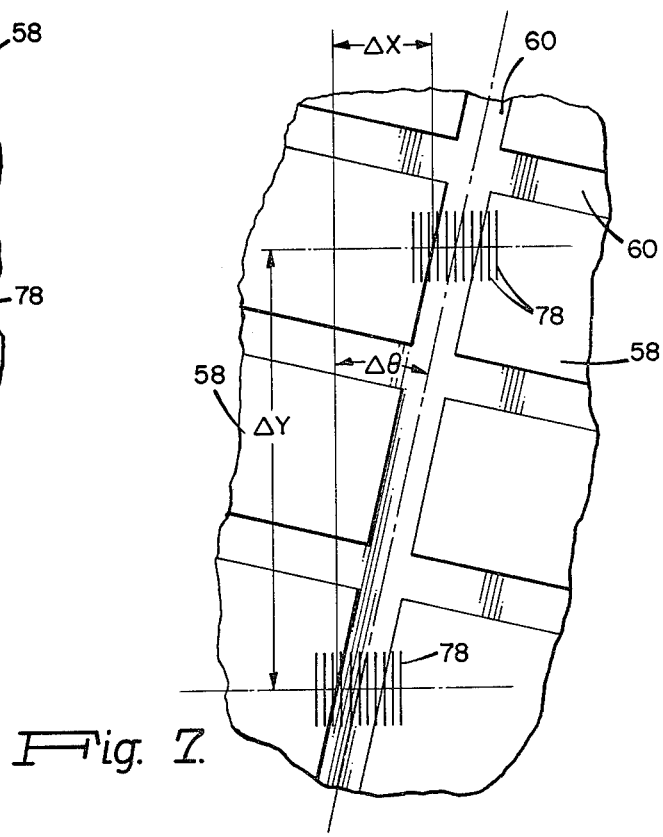
FIG. 7 is a view similar to FIG. 6, but illustrating the scan lines for another pair of microcircuits on the same sheet and the associated $\Delta X$, $\Delta Y$ and $\Delta \theta$ displacements of the upper pair of microcircuits with respect to the lower pair; and, FIG. 8 is a view in partial section and block diagram form illustrating a low-contact force Z-sensor for the targetless aligner.

Looking specifically at FIGS. 6 and 7, the subsequent fine alignment operation is based on a numerical score given to each scan line 78 of image sensor 54. As shown in FIG. 6, eleven scan lines are made each parallel to one of the principal axes i.e. the X or Y axis and incrementally spaced and normal to the other axis. In the preferred embodiment, the scan lines are parallel to the Y-axis and incrementally spaced along and normal to the X-axis.

For purposes of illustration, the numerical score is based on the combined effect of the total value of all points along the scan line and the number of changes. As shown in FIG. 6, each scan line is divided into twenty equally spaced points 80. Assuming for the moment that the intensity is black and white with respect to the "On" and Off" street conditions i.e. a score of one represents "On" the street and a zero represents "Off" the street, then if the scan is performed as shown in FIG. 6, lines Nos. 1, 2, 10 and 11 will score a sum of zero each while lines Nos. 5, 6 and 7 will score a full twenty. The remaining scan lines will score between ten and twenty and an edge of the street can be defined as, for example, a score of ten.

Each scan line corresponds to a distinct X coordinate (assuming the scan lines to be parallel to the Y principal axis). From inspection of FIG. 6, it can be seen that the left hand edge of the street 60 appears to be between lines 3 and 4. If the scan is moved down a fixed number of die lengths as shown in FIG. 7, the second left edge will be displaced by $\Delta X$ in X. From this, the corrective angle $\Delta \theta$ is calculated by the microcomputer 50. Corrective theta rotational signals from microcomputer 50 are then applied to the theta axis motor control 46 to cause rotation of the wafer 12. As the angle $\Delta \theta$ becomes smaller, the change from street to non-street becomes crisper.

After theta correction, the scan procedure is repeated as an iterative process until it is possible to scan the entire length of a street from one end of the wafer to another. At this point, the street is scanned at two points spaced substantially at opposite ends of a wafer diameter until the center differences is less than one minimum theta increment (e.g. less than 8 seconds).

The next operation in the fine alignment procedure is to locate the cross street in the X direction. The wafer is first positioned to center and then scanned in X until a street is found. Since the theta is already in perfect alignment, the center of the X street is readily determined.

Having described the course and fine alignment operations, it will be appreciated that the fine alignment scans of the semiconductor wafer are made parallel to one of the principal axes (X or Y and preferably Y) and in a direction that is substantially along the scribe line or "street." Given the initial course alignment operation, which produced a theta alignment within a predetermined angular range e.g. ±5°, the subsequent fine alignment scans will be within 5° of being parallel to the scanned scribe line or street.

This technique is in distinct contrast to the prior art systems in which the scan is transverse to the street i.e., scanning across the street to locate both edges of the street. In the present invention, the scan direction is "substantially along" the street or scribe line. The term "substantially along" has been chosen to describe the direction of the scan line with respect to the scanned street because the present invention utilizes an iterative process to reduce the theta error. Each set of scribe line scans e.g. lines 1–11 in FIG. 6, is used to generate a theta correction signal for theta adjustment of the wafer. After a given number of such adjustments, the wafer scribe, lines are positioned within a minimum theta increment of the selected principal axis i.e. "parallel" to the axis.

Therefore, as used herein, the term "substantially along" shall refer to a scan that is within five degrees of being parallel to the scribe line. However, since the process is iterative and the initial course theta alignment range can vary, one or more sets of fine alignment scans can be beyond the 5° range, but at least one set of scans will be within 5° of parallelism with the scanned scribe line or street.

It has already been mentioned that the targetless alignment method and apparatus of the present invention is particularly suited for use with automatic semiconductor wafer probers. When the article to be positioned is as delicate and expensive as a semiconductor wafer, unnecessary physical contact with the concomitant dangers of contamination and damage should be strenuously avoided. However, in the special case of a "probing" operation for purposes of conducting electrical tests, physical contact of the wafer with electrical "fingers" i.e. "probe tip" is necessary and therefore is an accepted practice in the semiconductor industry. The "probe tips" typically are thin metal wires which make light contact with the surface of the wafer.

In order to maintain contact pressure within the relatively narrow limits of a few grams, control of the "Z" relation between the wafer and the probe tip within a few thousandths of an inch is required. It is a characteristic of wafers due to their processing that they are generally neither flat nor rapidly changing in elevation (undulation). Typically, significant elevational changes occur in distances corresponding to 5 to 10% or more of the wafer diameter.

Figure 8:
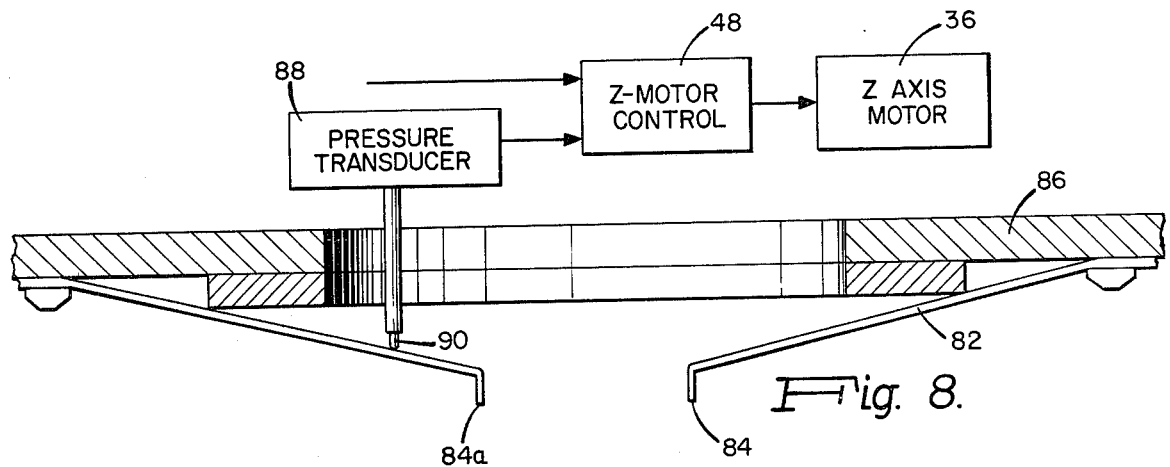

Although the previously mentioned height sensor 52 provides a "Z" axis reference position it is preferable in a prober to make the Z-axis sensing mechanism identical to the actual variable that should be controlled, which is not the gap, per se, but the "contact" pressure between the probe and wafer. FIG. 8 illustrates diagrammatically in partial section and block diagram form, a "Z" axis sensor for use with the semiconductor wafer alignment apparatus depicted in FIG. 1 in a prober embodiment. Referring to FIG. 8, a plurality of semiconductor wafer probes 82 each having a probe tip 84 are mounted on a conventional probe card 86. Contact pressure between the probe tips and the semiconductor wafer is sensed by the contact pressure on either an auxiliary probe tip 84 positioned at a convenient location or preferably on one of the actual probe tips 84 themselves. The probe tip contact force is transmitted to a transducer 88 through a rigid, electrically non-conductive member 90. The transducer 88 is a conventional device and can be any convenient sensor such as, a strain gage or force sensitive semiconductor. One such suitable device is sold by Stowe Laboratories, Kane Industrial Drive, Hudson, Mass. under the name "Pitran."

When the probe tip comes into contact with the wafer, pressure sensor feedback can be used to stop the motion initially when a minimum "Z" force level has been exceeded by a predetermined amount. In other words, the output from transducer 88 can be used as an input to the Z motor control 48 to control the operation of the Z-axis motor 36 and thereby the contact pressure on the wafer by the probe tips. In the subsequent probing operation, the "Z" wafer position is adjusted by means of feedback from the transducer 88.

The transducer 88, depending upon the particular application, can be used as a part of an active "Z" servo positioning loop using either a signal proportional to pressure or by means of a thresholding technique, with a single trigger point, or a high/low level trigger point "bang-bang" servo. In either of these cases, a standard servo positioning technique using either a simple position servo or for more accuracy a position servo with velocity feedback produces "Z" control within the desired limits.

However, it should be noted that it is not necessary to have an active servo loop in the prober embodiment in which variations in "Z" height occur slowly. Thus, a correction to a memory stored desired "Z" can be initiated by coming into contact at the beginning of the wafer and then using the reading at each die to correct for the subsequent die i.e. step-adjustments and an open loop. In either instance the controlling and controlled phenomenon become one i.e. force sensed on probe tip 84A.

Having described the preferred embodiment of the targetless alignment method and apparatus of the present invention, it will now be apparent to those skilled in the art that numerous modifications can be made therein without departing from the scope of the invention as defined in the appended claims. For example, in the preferred embodiment, the "edge" of a street or scribe line is located parallel to a principal axis. However, the "edge" concept can be utilized other ways. Thus, the "edge" can be equally well a row of pads or interleaved beams leads as shown in FIGS. 4A and 4B. In these cases the scan line score has three components: magnitude, pulse width, and frequency. The "best edge" is selected from the component change that is the crispest.

What we claim and desire to secure by Letters Patent of the United States:

1. An apparatus for X, Y, and $\theta$ axis aligning a semiconductor wafer having a plurality of microcircuits formed on the wafer in a pattern of rows and columns separated by scribe lines, said apparatus comprising:
   A. electro-optical means for scanning at least a portion of each of said microcircuits and of said scribe lines abutting said microcircuits along a plurality of scan lines that are parallel to one of said X and Y principal axes in a direction substantially along the scribe line to locate a straight line edge in said micocircuit pattern;
   B. means for determining from the location of said straight line edge the $\theta$ axis error of the edge with respect to one of said X and Y principal axes; and
   C. means for rotating said wafer about the $\theta$ axis to reduce said $\theta$ axis error.

2. An apparatus for X, Y, and $\theta$ axis aligning a semiconductor wafer having a plurality of microcircuits formed on the wafer in a pattern of rows and columns separated by scribe lines, said apparatus comprising:
   A. electro-optical means for scanning at least a portion of each of said microcircuits and of said scribe lines abutting said microcircuits along a plurality of scan lines that are parallel to one of said X and Y principal axes in a direction substantially along the scribe line to locate one edge of a scribe line along one of said microcircuits;
   B. electro-optical means for scanning at least a portion of each of said microcircuits and of said scribe lines abutting said microcircuits along a plurality of scan lines that are parallel to one of said X and Y principal axes in a direction substantially along the scribe line to locate the same edge of the scribe line along another microcircuit;
   C. means for determining from the location of said two microcircuit scribe line edges the $\theta$ axis error of the scribe line edges with respect to one of said X and Y principal axes; and, D. means for rotating said wafer about the $\theta$ axis to reduce said $\theta$ axis error.

3. An apparatus for X, Y and $\theta$ axis aligning a semiconductor wafer having a wafer flat and a plurality of microcircuits formed on the wafer in a pattern of rows and columns separated by scribe lines that have a specific angular relationship with the wafer flat, said apparatus comprising:

A. means for rotating the wafer about the $\theta$ axis until the wafer flat is within a predetermined orientation range with respect to the X and Y principal axes;

B. electro-optical means for scanning at least a portion of each of said microcircuits and of said scribe lines abutting said microcircuits along a plurality of scan lines that are parallel to one of said X and Y principal axes in a direction substantially along the scribe line to locate one edge of a scribe line along one of said microcircuits;

C. electro-optical means for scanning at least a portion of each of said microcircuits and of said scribe lines abutting said microcircuits along a plurality of scan lines that are parallel to one of said X and Y principal axes in a direction substantially along the scribe line to locate the same edge of the scribe line along another microcircuit;

D. means for determining from the location of said two microcircuit scribe line edges the $\theta$ axis error of the scribe line edges with respect to one of said X and Y principal axes; and, E. means for rotating said wafer about the $\theta$ axis to reduce the $\theta$ axis error.

4. An apparatus for X, Y, and Z axis aligning a semiconductor wafer having a plurality of microcircuits formed on the wafer in a pattern of rows and columns separated by scribe lines, said apparatus comprising:

A. means for locating a straight line edge in said microcircuit pattern;

B. means for determining from the location of said straight line edge the $\theta$ axis error of the edge with respect to one of said X and Y principal axes;

C. means for rotating said wafer about the $\theta$ axis to reduce said axis error;

D. a pressure sensor;

E. means for moving the semiconductor wafer along the Z axis into pressure contact with said pressure sensor; and, F. means for terminating the movement of the semiconductor wafer along the Z axis when the pressure sensor senses a predetermined contact pressure.

5. The apparatus of claim 4 further comprising means responsive to the sensed contact pressure for moving the semiconductor wafer in one direction to increase contact pressure and in the opposite direction to decrease contact pressure in order to maintain said predetermined contact pressure whereby undulations in wafer height can be accommodate.

6. The apparatus of claim 4 wherein said pressure sensor includes means for physically contacting the semiconductor wafer, said wafer contacting means being electrically insulated from said pressure sensor.

7. A method for X,Y and $\theta$ axis aligning a semiconductor wafer having a wafer flat and a plurality of microcircuits formed on the wafer in a pattern of rows and coluns separated by scribe lines that have a specific angular relationship with the wafer flat, and different electro-magnetic radiation reflection characteristics from the microcircuits, said method comprising the steps of:

A. course aligning the wafer by rotating the wafer about the $\theta$ axis until the wafer flat is within a predetermined orientation range with respect to the X and Y principal axes; and, B. fine aligning the wafer by:
 (i) locating one edge of a scribe line along one of said microcircuits;
 (ii) locating the same edge of the scribe line along another microcircuit by opto-electrically scanning at least a portion of each of said microcircuits and of said scribe lines abutting said microcircuits along a plurality of scan lines that are parallel to one of said X and Y principal axes in a direction substantially along the scribe line;
 (iii) determining from the location of said two microcircuit scribe line edges the $\theta$ axis error of the scribe line edges with respect to one of said X and Y principal axes; and,
 (iv) rotating said wafer about the $\theta$ axis to reduce said $\theta$ axis error.

8. The method of claim 7 further comprising the step of repeating step (B) at least once.

* * * * *